United States Patent
Kang et al.

(10) Patent No.: US 12,446,306 B2
(45) Date of Patent: Oct. 14, 2025

(54) STACKED FIELD EFFECT TRANSISTOR STRUCTURE WITH INDEPENDENT GATE CONTROL BETWEEN TOP AND BOTTOM GATES

(71) Applicant: INTERNATIONAL BUSINESS MACHINES CORPORATION, Armonk, NY (US)

(72) Inventors: Tsung-Sheng Kang, Ballston Lake, NY (US); Su Chen Fan, Cohoes, NY (US); Jingyun Zhang, Albany, NY (US); Ruqiang Bao, Niskayuna, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 18/050,032

(22) Filed: Oct. 26, 2022

(65) Prior Publication Data

US 2024/0145473 A1    May 2, 2024

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/031* (2025.01); *H10D 30/43* (2025.01); *H10D 30/6729* (2025.01); *H10D 30/6735* (2025.01); *H10D 62/121* (2025.01); *H10D 64/017* (2025.01);
(Continued)

(58) Field of Classification Search
None
See application file for complete search history.

(56) References Cited

U.S. PATENT DOCUMENTS 10,164,121 B2    12/2018    Hatcher et al.
10,510,622 B1    12/2019    Frougier et al.
(Continued)

FOREIGN PATENT DOCUMENTS

CN    110783273 A    2/2020
CN    120130136 A    6/2025
(Continued)

OTHER PUBLICATIONS

Nguyen, S. et al., "The Characterization of Electron Cyclotron Resonance Plasma Deposited Silicon Nitride and Silicon Oxide Films"; J. Electrochem. Soc. (1989); vol. 136:10, pp. 2835-2840.
(Continued)

*Primary Examiner* — Nduka E Ojeh
(74) *Attorney, Agent, or Firm* — Kimberly Zillig; Otterstedt & Kammer PLLC

(57) ABSTRACT

A semiconductor device includes a first transistor and a first gate electrically coupled to the first transistor. A second transistor is positioned on top of the first transistor. A second gate is electrically coupled to the second transistor. A dielectric isolation layer is positioned between the first gate and the second gate. A first conductive contact is electrically coupled to the first gate. A second conductive contact is electrically coupled to the second gate. A control of the first gate through the first conductive contact is independent of a control of the second gate through the second conductive contact.

20 Claims, 12 Drawing Sheets

(51) Int. Cl.
*H10D 30/43* (2025.01)
*H10D 30/67* (2025.01)
*H10D 62/10* (2025.01)
*H10D 64/01* (2025.01)
*H10D 84/01* (2025.01)
*H10D 84/03* (2025.01)
*H10D 88/00* (2025.01)

(52) U.S. Cl.
CPC ..... *H10D 84/0167* (2025.01); *H10D 84/0186* (2025.01); *H10D 84/0188* (2025.01); *H10D 84/038* (2025.01); *H10D 88/01* (2025.01)

(56) References Cited

U.S. PATENT DOCUMENTS

| | | |
|---|---|---|
| 10,749,518 B2 | 8/2020 | Maxim et al. |
| 11,315,938 B1 | 4/2022 | Reznicek et al. |
| 11,367,662 B2 | 6/2022 | Dentoni Litta et al. |
| 11,367,722 B2 | 6/2022 | Lilak et al. |
| 2020/0006479 A1* | 1/2020 | Reznicek ............ H10D 86/201 |
| 2021/0265345 A1 | 8/2021 | Xie et al. |
| 2021/0265348 A1 | 8/2021 | Xie et al. |
| 2021/0376137 A1* | 12/2021 | Yang ................ H10D 30/62 |
| 2023/0029046 A1* | 1/2023 | Chung ............. H10D 30/6735 |

FOREIGN PATENT DOCUMENTS

| | | |
|---|---|---|
| EP | 2419931 B | 4/2017 |
| TW | I703823 B | 9/2020 |
| WO | 2024/088205 A1 | 5/2024 |

OTHER PUBLICATIONS

Disclosed Anonymously, "Separate Channel Release in Stacked Nanosheet Field Effect Transistors by Liner Protection"; IP.com (2021); IP.com No. IPCOM000265848D, 12 pgs.

International Search Report and Written Opinion issued Jan. 3, 2024 is related application No. PCT/CN2023/125894, 8 pgs.

* cited by examiner

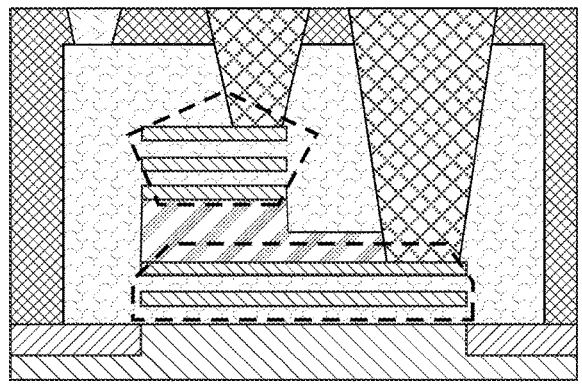
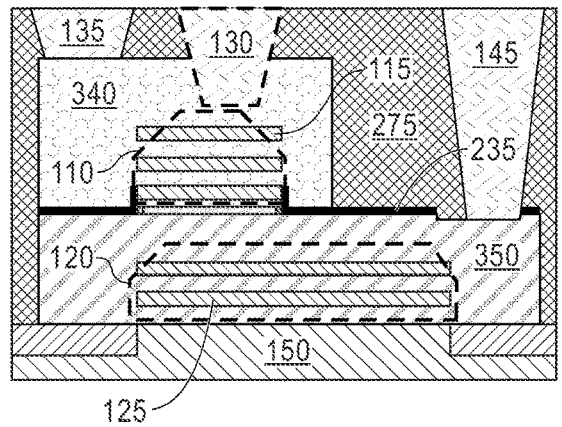
FIG. 1A
Prior Art
FIG. 1B
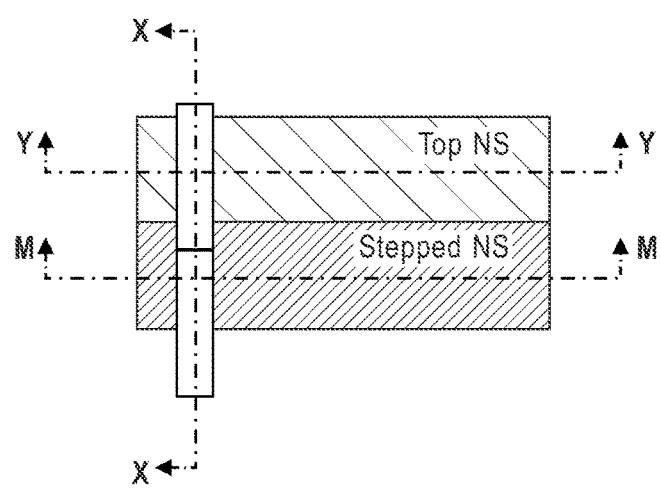
FIG. 2

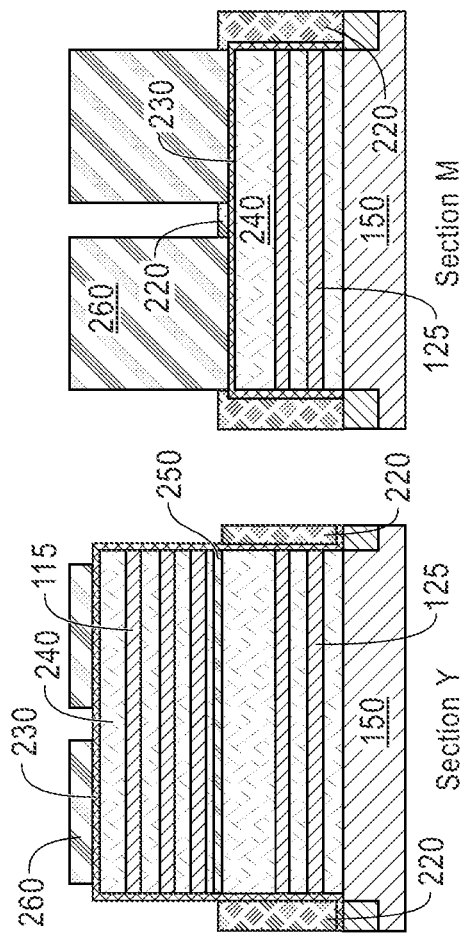
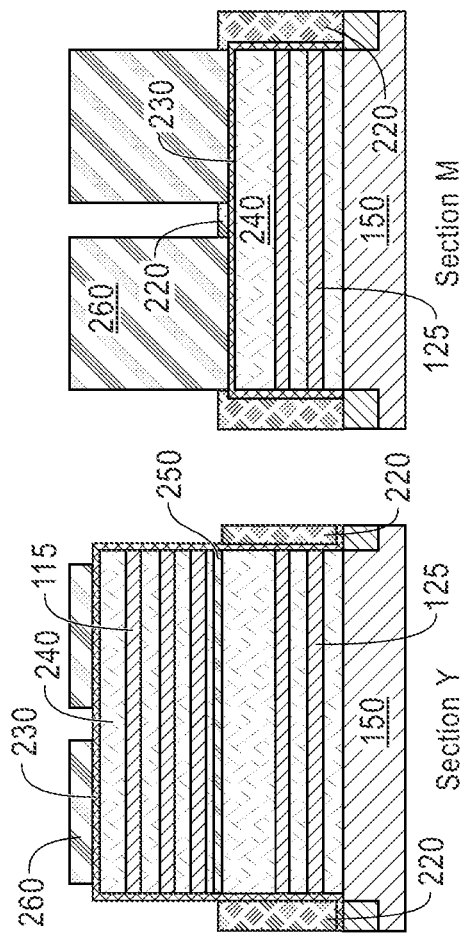
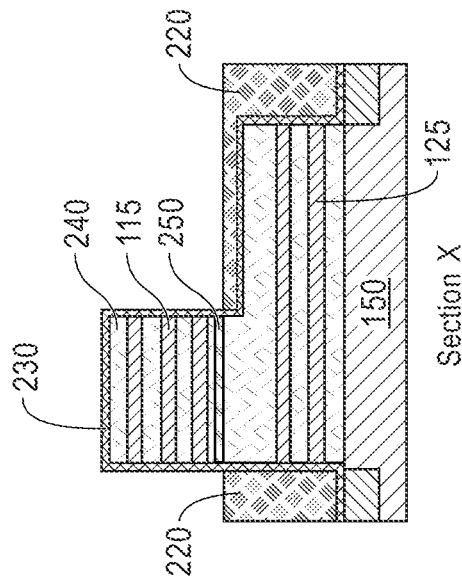
FIG. 5A   FIG. 5B   FIG. 5C
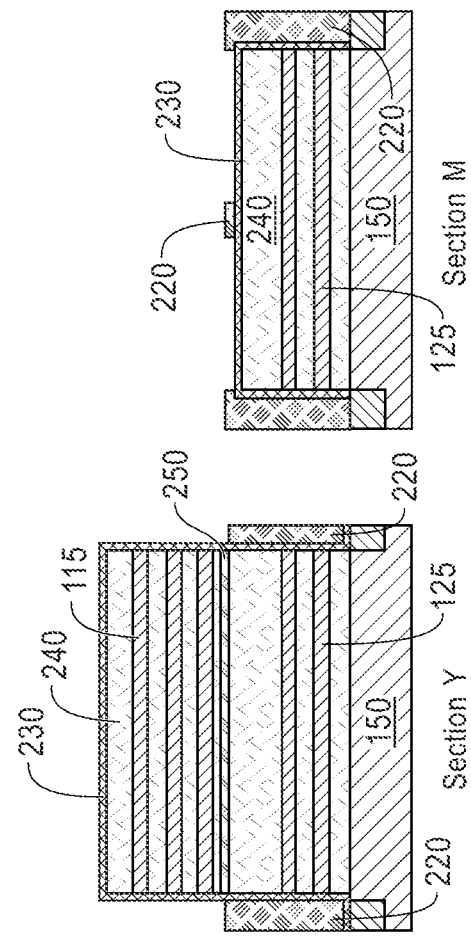
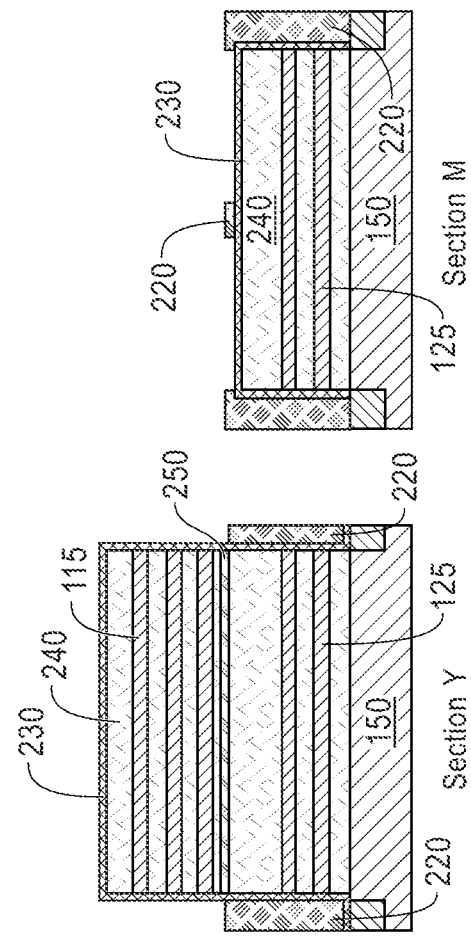
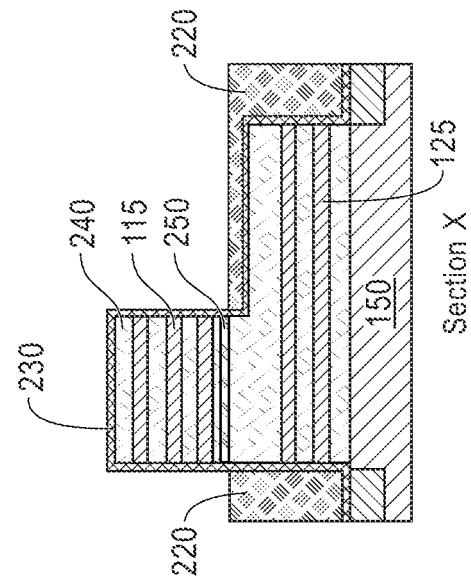
FIG. 6A   FIG. 6B   FIG. 6C

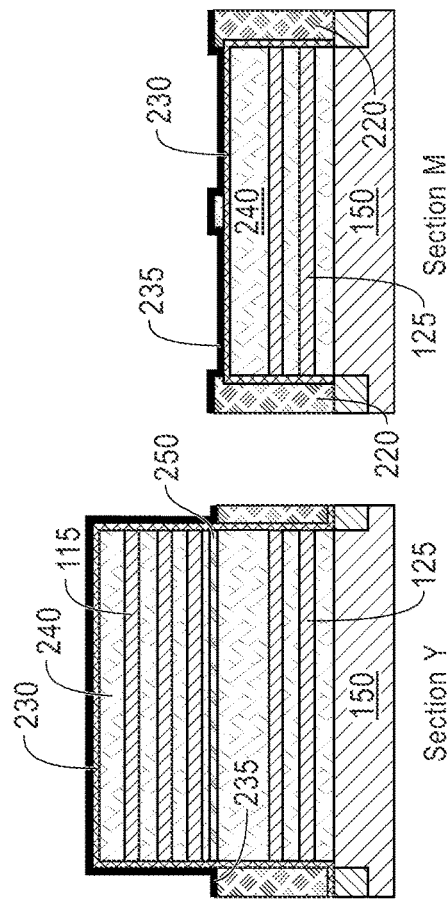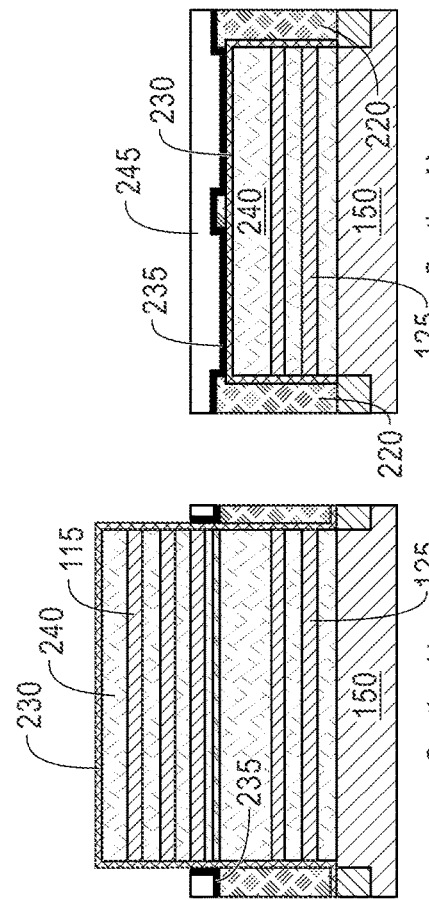

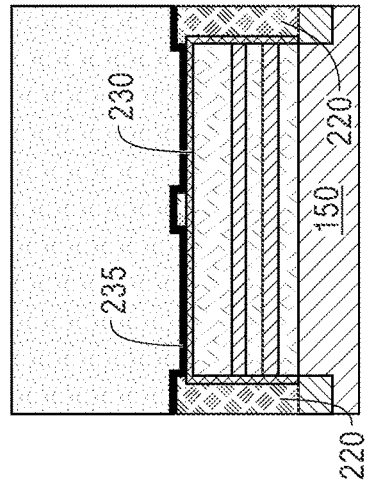
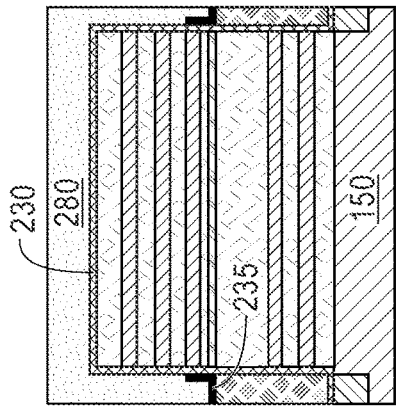
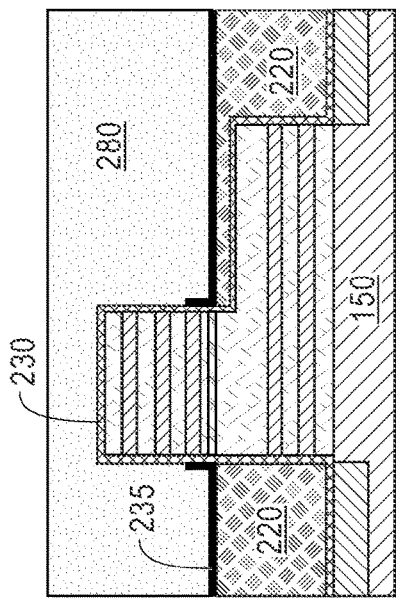
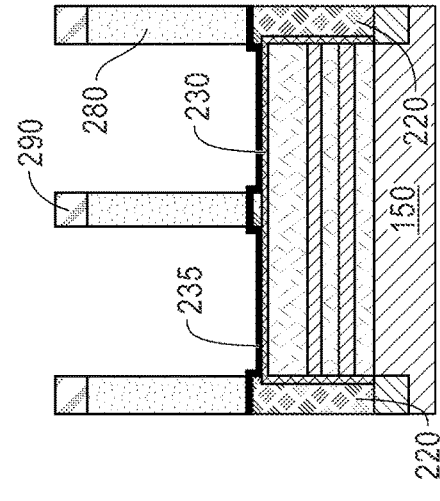
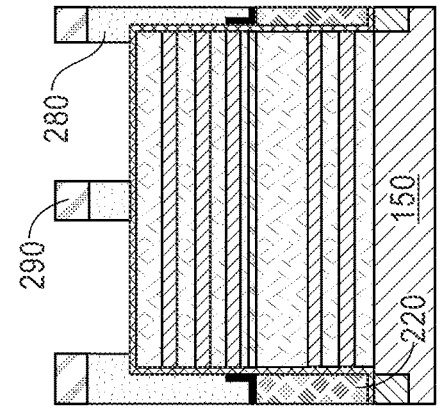
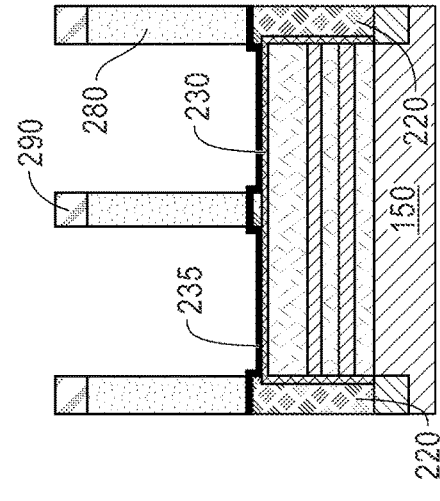

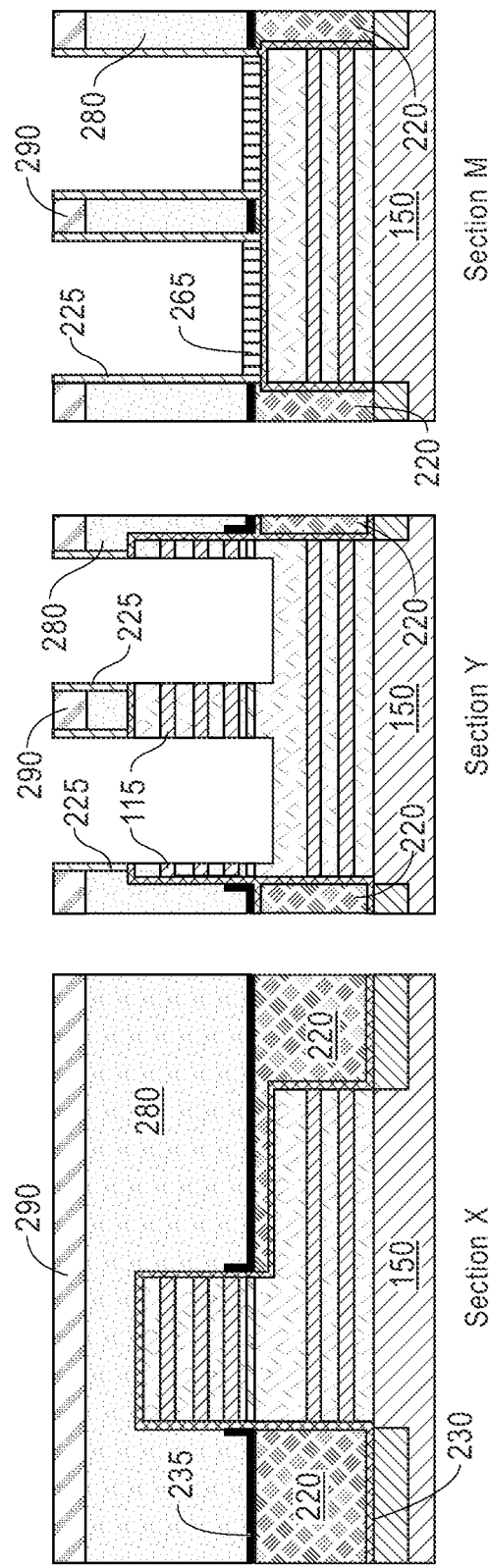

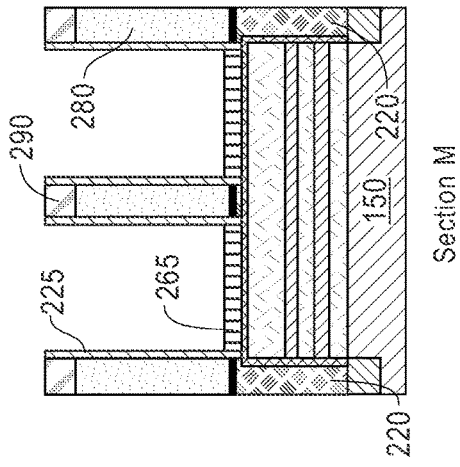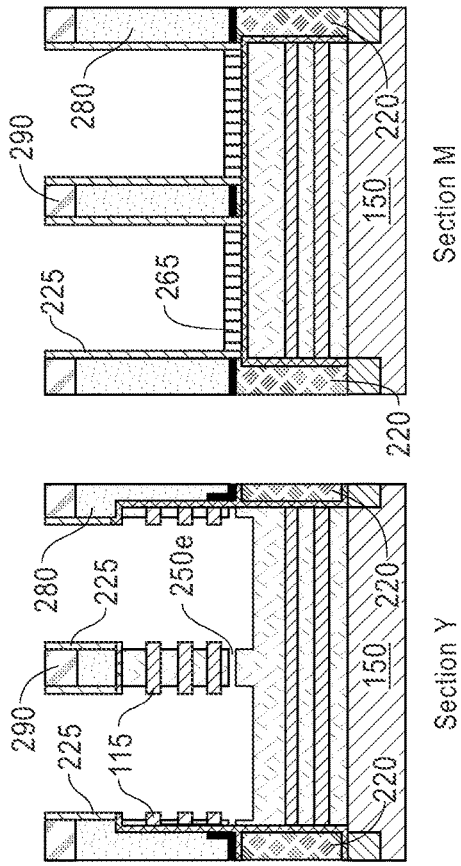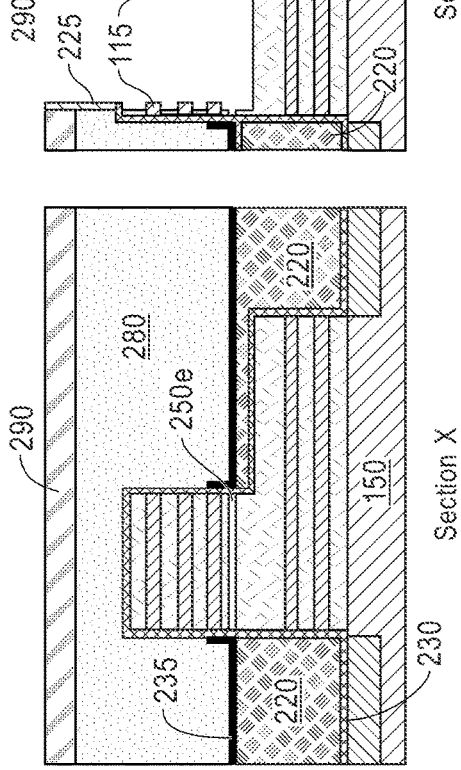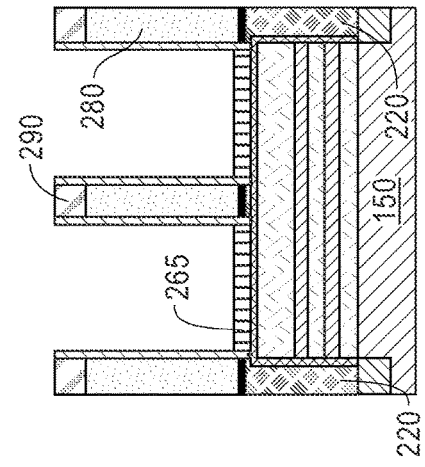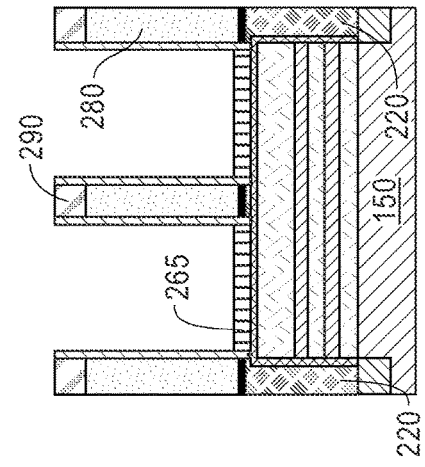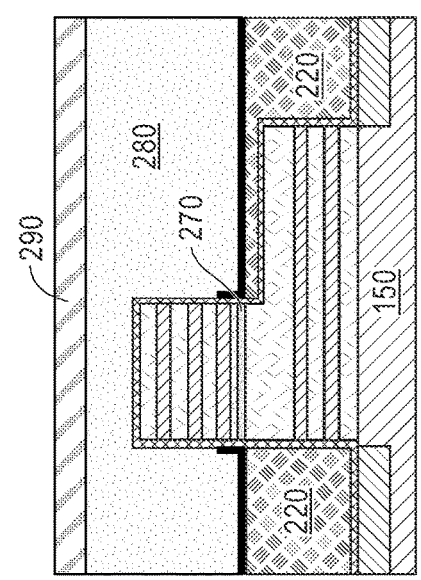

Section X

Section Y

Section M

Section X

Section Y

Section M

Section X

Section Y

Section M

Section X

Section Y

Section M

Section X

Section Y

Section M

Section H

Section X

Section Y

Section M

Section H

STACKED FIELD EFFECT TRANSISTOR STRUCTURE WITH INDEPENDENT GATE CONTROL BETWEEN TOP AND BOTTOM GATES

BACKGROUND

Technical Field

The present disclosure generally relates to electrical devices, and more particularly, to a stacked FET structure that enables independent gate control of top and bottom gates.

Description of the Related Art

In stacked nanosheet transistor structures, gate control of individual transistors may commonly be shared by the same gate element. FIG. 1A shows a conventional stacked transistor device. As can be seen by the figure, the top and bottom transistors share the same gate. In some devices, the top and bottom transistors may be different types of devices (for example, a pFET and an nFET). In I/O circuit design, not all the gates of nFET/pFET structures are connected. By sharing the same gate, an nFET can induce noise in a circuit that is connected to the pFET.

While noise is unwanted, current fabrication processes are typically limited by a standard practice of forming a dummy gate area for all channels in a stacked nanosheet structure. Nanosheets of semiconductor channels are formed with sacrificial layers that eventually define insulators between each channel layer. A dummy gate material is deposited around the nanosheet stacks until the signal channels are defined. When the dummy gate material is removed, the dummy gate cavities are adjacent all the signal channels. The gate material indiscriminately fills the cavities adjacent the channels so that each transistor is in contact with the same gate metal. So, when a signal is conducted by the gate for one transistor, the other transistor sharing contact with the same gate material can induce a parasitic element such as noise.

SUMMARY

In general, embodiments provide a semiconductor device and method of manufacture that enables independent gate control between top and bottom gates in a stacked transistor device. Stacked transistors no longer require sharing the same gate element. By separating gate control, the device eliminates parasitic elements such as noise from a transistor that is not part of a circuit generating a signal but shares the gate with a transistor that is being used in a different circuit generating a signal.

According to an embodiment of the present disclosure, a semiconductor chip device is provided. The semiconductor device includes a first transistor and a first gate electrically coupled to the first transistor. A dielectric isolation layer is on top of at least a portion of the first transistor. A second transistor is on top of at least a portion of the dielectric isolation layer. A second gate is electrically coupled to the second transistor. The dielectric isolation layer is disposed to isolate the first gate from the second gate. A first conductive contact is electrically coupled to the first gate. The first conductive contact is within a first lateral boundary of the first transistor and outside of a second lateral boundary of the second transistor.

In an embodiment, a second conductive contact is electrically coupled to the second gate. The second conductive contact is within the first lateral boundary and within the second lateral boundary. As may be appreciated, the structure defines individual access to respective gates by offsetting the boundaries of each gate. In a stacked structure, the gates usually share the same contact because the bottom gate is obstructed from access to the top side by the top gate. However, by offsetting the gate boundaries, a pathway opens up to access the bottom gate independently of the top gate.

According to an embodiment of the present disclosure, a semiconductor chip device is provided. The semiconductor device includes a first transistor and a first gate electrically coupled to the first transistor. A second transistor is positioned on top of the first transistor. A second gate is electrically coupled to the second transistor. A dielectric isolation layer is positioned between the first gate and the second gate. A first conductive contact is electrically coupled to the first gate. A second conductive contact is electrically coupled to the second gate. A control of the first gate through the first conductive contact is independent of a control of the second gate through the second conductive contact.

In an embodiment, which may be combined with the preceding embodiments, the semiconductor device includes a third conductive contact electrically coupled to a first source/drain of the first transistor. The third conductive contact is connected to a frontside of the first transistor. A fourth conductive contact is electrically coupled to a second source/drain of the first transistor. The fourth conductive contact is connected to the frontside of the first transistor. A fifth conductive contact is electrically coupled to a first source/drain of the second transistor. The fifth conductive contact is connected to the frontside of the second transistor. A sixth conductive contact is electrically coupled to a second source/drain of the second transistor. The sixth conductive contact is connected to the frontside of the second transistor. When combined with the independent gate access, access to the bottom transistor elements may be achieved simultaneously with access to the top transistor elements from the front side of the device. As such, the manufacturing process may be made easier by forming access to stacked transistors entirely on the front side of the device.

According to an embodiment of the present disclosure, a method of manufacturing a semiconductor device is provided. The method includes forming a first stack of nanosheets on a substrate. A second stack of nanosheets is formed on top of the first stack of nanosheets. A first dummy gate is formed adjacent the first stack of nanosheets and below a bottom nanosheet of the second stack of nanosheets. A dielectric isolation layer is formed on top of the first dummy gate and in between the first stack of nanosheets and the second stack of nanosheets. A second dummy gate is formed on top of the dielectric isolation layer and adjacent the second stack of nanosheets. The first dummy gate is replaced with a bottom gate electrically coupled to the first stack of nanosheets. The first stack of nanosheets form a first transistor in cooperation with gate material of the bottom gate. The second dummy gate is replaced with a top gate electrically coupled to the second stack of nanosheets. The second stack of nanosheets form a second transistor in cooperation with gate material of the top gate. A first conductive contact is formed electrically coupled to the bottom gate. A second conductive contact is formed electrically coupled to the top gate. A control of the bottom gate through the first conductive contact is independent of a control of the top gate through the second conductive contact.

In an embodiment, which may be combined with the preceding embodiments, the method includes forming a third conductive contact electrically coupled to a first source/drain of the first transistor. The third conductive contact is connected to a backside of the first transistor. A fourth conductive contact is formed electrically coupled to a second source/drain of the first transistor. The fourth conductive contact is connected to the backside of the first transistor. A fifth conductive contact is formed electrically coupled to a first source/drain of the second transistor. The fifth conductive contact is connected to the frontside of the second transistor. A sixth conductive contact is formed electrically coupled to a second source/drain of the second transistor. The sixth conductive contact is connected to the frontside of the second transistor. This embodiment provides backside access to the bottom transistor elements which may be useful in applications that include backside layers. For example, some applications include a back end of line layer and/or a wafer carrier on the backside of the device. Connections to the bottom transistor become available from the backside which saves top side area for more circuit elements.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1A is a cross-sectional view of a conventional field effect transistor with a shared gate control.

FIG. 1B is a cross-sectional view of a field effect transistor with independent control of a top gate and a bottom gate consistent with embodiments of the present disclosure.

FIG. 2 is a legend showing axes of perspective for the views in FIGS. 3A, 3B, 3C-18A, 18B, and 18C, consistent with embodiments of the present disclosure.

FIGS. 5A-5C show views of etching down the hard mask and some of the dummy gate material, according to an embodiment.

FIGS. 6A-6C show views of removing the organic planarization layer, according to an embodiment.

FIGS. 7A-7C show views of depositing a dielectric isolation layer, according to an embodiment.

FIGS. 8A-8C show views of removing some of the dielectric isolation layer from the top stack of nanosheets, according to an embodiment.

FIGS. 9A-9C show views of depositing a top section of dummy gate material around the top stack of nanosheets, according to an embodiment.

FIGS. 10A-10C show views of patterning the top section of dummy gate material, according to an embodiment.

FIGS. 11A-11C show views of recessing down through the top stack of nanosheets, according to an embodiment.

FIGS. 12A-12C show views selectively removing sacrificial layer material from the top stack of nanosheets and from part of the bottom stack of nanosheets, according to an embodiment.

FIGS. 13A-13C show views of depositing space material into cavities formed by the selective removal of sacrificial layer material, according to an embodiment.

DETAILED DESCRIPTION

Overview

Figure 3A:
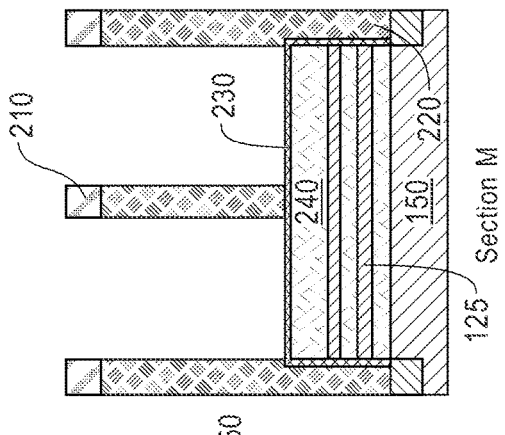
FIGS. 3A-3C show views of an initial starting formation for a process of fabricating a semiconductor with independent gate control according to embodiments.

In conventional stacked transistor devices, transistor structures generally have to share the same gate element and share a metal contact. The shared gate control leads to various signal issues including unwanted noise from a neighboring transistor that is not part of a circuit. In general, embodiments in the disclosure provide a semiconductor device that enables independent gate control between top and bottom gate-all around structures in a transistor. In one example, the device is a field effect transistor (FET) with a stacked nanosheet structure.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," "above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. The phrase "electrically connected" does not necessarily mean that the elements must be directly in physical contact together—intervening elements may be provided between the "connected" or "electrically connected" elements.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Example Device Structure

Referring now to FIG. 1B, a cross-sectional view of a semiconductor device 100 (referred to generally as the "device 100") is shown, consistent with embodiments of the disclosure. The device 100 includes a first transistor structure 110 and a second transistor structure 120. The area for each of the transistor structures 110 and 120 is demarcated by a dashed line. Both transistor structures 110 and 120 may include a plurality of stacked nanosheet semiconductor channels (115 and 125 respectively). The transistor structures 110 and 120 may be either pFET, nFET, or one each of pFET or nFET type transistors. In the embodiment shown, the transistor structure 110 is stacked on top of the transistor structure 120. Accordingly, sometimes the transistor structure 110 will be referred to as the "top transistor 110" and the transistor structure 120 will be referred to as the "bottom transistor 120". Embodiments may also include a gate element 340 dedicated to the top transistor 110 and a gate element 350 independent of the gate element 340 and dedicated to the bottom transistor 120. The gate element 340 may sometimes be referred to as the "top gate 340" consistent with embodiments referring to the "top transistor 100". The gate element 350 may sometimes be referred to as the "bottom gate 350" consistent with embodiments referring to the "bottom transistor 120". The device 100 includes a dielectric isolation layer 235 separating or partitioning off the gate element 340 from the gate element 350. The transistor structures 110 and 120, the gate element 340, and the gate element 350 may be supported by a substrate 150. Embodiments will also generally include a metal contact 135 in electrical connection with the first transistor structure 110. Embodiments may include separate metal contacts for the top and bottom gates 340 and 350. A metal contact 135 may be electrically connected to the gate element 340 from a top side of the device 100. A metal contact 145 may be electrically connected and dedicated to the gate element 350. While not shown in this figure, embodiments may include a separate metal contact electrically connected to the transistor 120.

Example Methodology of Manufacture

In the following, a process describes a general method of forming a semiconductor device that has independent gate control for multiple transistors in the same device. FIG. 2 shows a legend providing the various views of the semiconductor device during the fabrication process. Axis "X" is from and end perspective of a stack of nanosheets showing the bottom and top gates. Axis "Y" is from a side perspective along the top of the nanosheet stack. Axis "M" is from a perspective down the center of the bottom stack of nanosheets.

Figure 3B:
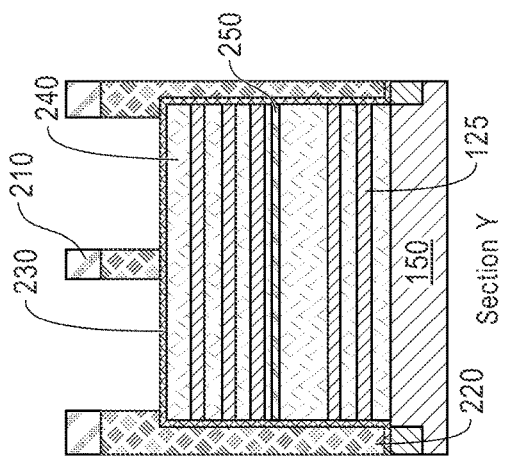
Figure 3C:
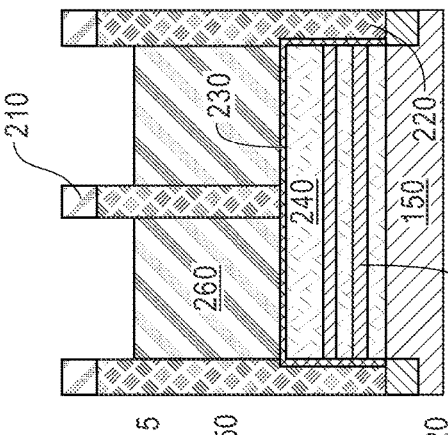

Reference is now made beginning at FIGS. 3A-3C to describe, by illustration, a method for manufacturing a semiconductor device 100 with independent gate control of top and bottom transistors. FIGS. 3A-20D show a fabrication process including additive and subtractive processes to form some circuit elements in the end device. The additive and subtractive processes involved (for example, masking, depositing, etching, lithography, etc.) may be known to those of skill in the art and will not necessarily be identified in each act shown. The fabrication of the devices described herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, a device can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit. In some figures, some reference numerals for elements not being affected by a step may not be repeated.

Referring now to FIGS. 3A-3C, the process is shown from an initial starting point that includes a first stack of nanosheets formed under a second stack of nanosheets on a substrate 150. Those of ordinary skill in the art will understand the process to arrive at this initial structure without explanation of the formation of nanosheets on the substrate 150. References to "first" structures may generally refer to the bottom gate and bottom transistor elements. References to "second" structures may generally refer to the top gate and top transistor elements.

The first stack of nanosheets includes alternating layers of a sacrificial material 240 (e.g., comprising silicon-germanium with a germanium concentration of 30% (SiGe30)) and semiconductor layers (e.g., silicon) 125. The second stack of nanosheets is similar to the first stack except that the semiconductor layers are called out as 115. In addition, the first stack of nanosheets may be formed longer in the lateral direction than the width of the second stack, as shown from the perspective shown in FIG. 3A. Some embodiments include a sacrificial layer 250 (for example, SiGe 60) formed between the first stack of nanosheets and the second stack of nanosheets. As a preface of the end result, the second stack of nanosheets will be used to define the second (or top) transistor structure 110 while the first stack of nanosheets will be used to define the first (or bottom) transistor structure 120 (both shown in FIG. 1B).

An oxide layer 230 may be formed on top of both the top and bottom stacks of nanosheets. A first dummy gate material 220 is formed on top of the oxide layer 230. The first dummy gate material 220 surrounds both the top stack of nanosheets and the bottom stack of nanosheets at this stage. A hard mask 210 may be added to the top of the structure to define areas for recess.

Figure 4A:
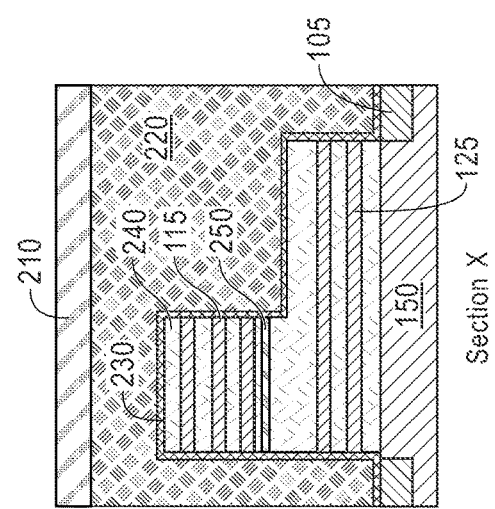
FIGS. 4A-4C show views of depositing a hard mask and organic planarization layer, according to an embodiment.
Figure 4B:
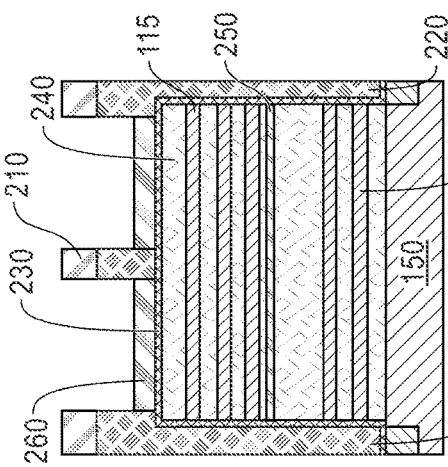
Figure 4C:
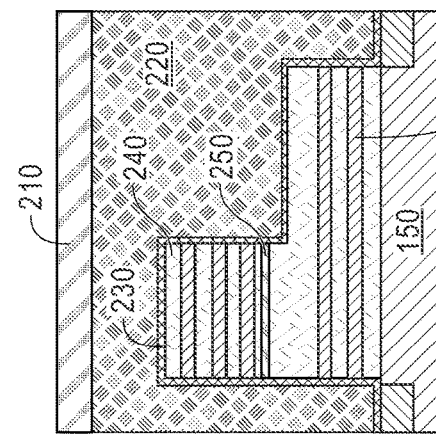

FIGS. 4A-4C show deposition of an organic planarization layer (OPL) 260 into the recesses that resulted from FIGS. 3B and 3C.

In FIGS. 5A-5C, the hard mask 210 has been stripped away. The dummy gate material 220 is etched down around the second stack of nanosheets (using for example, a reactive ion etching (RIE)). On the vertical plane, the top level of the dummy gate material 220 may be removed until the top level is below the bottom most semiconductor layer 115. In the embodiment shown, removal is performed down to the same level as the sacrificial layer 250 but some dummy gate material 220 remains on top of the oxide layer 230, above and to the sides of the first stack of nanosheets. In FIGS. 6A-6C, the OPL 260 may be removed exposing the oxide layer 230 all around the second stack of nanosheets. As a preface, the remaining dummy gate material 220 defines the gate area for the bottom transistor 120.

In FIGS. 7A-7C, a layer of dielectric 235 (for example, silicon nitride or any non-EG oxide) is deposited on top of the oxide layer 230 and the dummy gate material 220 using for example, an atomic layer deposition (ALD) process. FIGS. 8A-8C show deposition of an OPL 245 over the dielectric 235 that is positioned over the dummy gate material 220. Some of the OPL 245 may cover the vertical parts of the dielectric 235 that go up the side of the base of the top stack of nanosheets. The dielectric 235 that surrounds the top stack of nanosheets, above the OPL 245 may be removed, exposing oxide layer 230.

In FIGS. 9A-9C, a second dummy gate material 280 may be deposited on top of the dielectric 235 and exposed sections of the oxide 230 that surround the top stack of nanosheets. The second dummy gate material 280 may be the same or different than the dummy gate material 220. Some of the second dummy gate material 280 is deposited in areas planned for formation of the top gate element. As may be appreciated, the position of the dielectric 235 insulates the top gate area from the bottom gate area (outside of the area that transitions from the top transistor to the bottom transistor), which will eventually lead to forming connections that provide independent control of the top gate element from the bottom gate element. FIGS. 10A-10C show patterning of recesses into the dummy gate material 280 using a gate hard mask 290.

FIGS. 11A-11C show performing a recess into the top stack of nanosheets. The level of recess may extend past the sacrificial layer 250, into the topmost sacrificial layer 240 of the bottom stack of nanosheets. Some embodiments may include depositing a spacer layer 225 on the sides of the recessed walls. Some embodiments include depositing a dielectric layer 265 on sections of the oxide layer 230 that cover the bottom stack of nanosheets, using for example a spin on glass (SOG) process.

In FIGS. 12A-12C, material in the sacrificial layers 240 in the top stack of nanosheets may be selectively removed to form indentations recessed inward from the sides of the semiconductor channels 115 (See FIG. 12B). The removal of material may occur as far down as the topmost sacrificial layer 240 of the bottom stack of nanosheets. In addition, the same process for removing the sacrificial layers 240 may completely remove the sacrificial layer 250 from between the top nanosheet stack and the bottom nanosheet stack leaving behind a space 250e. In FIGS. 13A-13C, the cavities defining the indentations and the space 250e left behind from removal of sacrificial layer material may be filled with an insulating spacer material 270. The insulating spacer material 270 provides a conductive barrier between the top transistor structure 110 and the bottom transistor structure 120. At this stage, the insulating spacer material 270 cooperates with the dielectric layer 235 to form an insulation barrier between the top gate area and the bottom gate area.

Figure 14A:
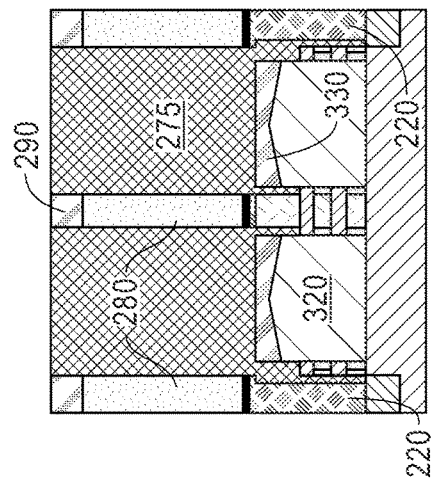
FIGS. 14A-14C show views removing some of the bottom gate material, according to an embodiment.
Figure 14B:
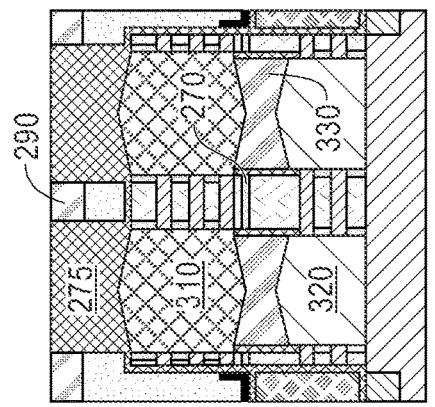
Figure 14C:
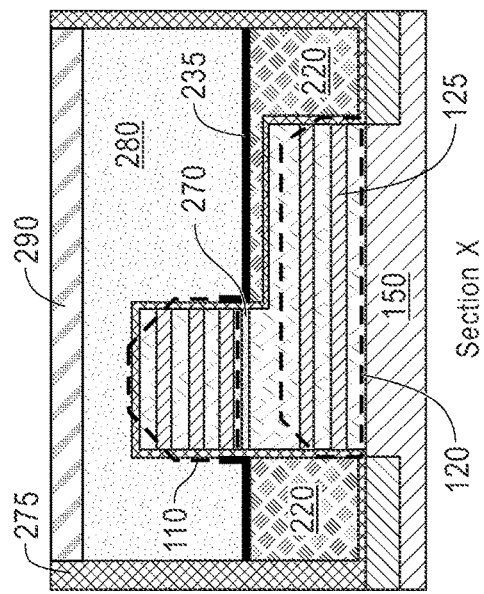

FIGS. 14A-14C show a process of removing some of the dummy gate materials 220 and 280 (exposing oxide 275 in the process) using a hard mask 290. The left and right edges of the dummy gate material 220 define lateral boundaries for the bottom gate area. In FIG. 14B, the source-drain material 310 (which is oriented horizontally) for the top transistor is shown. In FIGS. 14B and 14C, the source-drain material 320 (which is oriented horizontally) for the bottom transistor is shown. An insulator 330 is positioned in between the top transistor source-drain 310 and the bottom transistor source-drain 320.

Figure 15A:
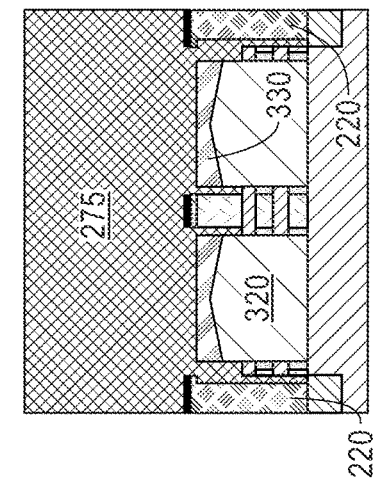
FIGS. 15A-15C show views removing some of the top gate material, according to an embodiment.
Figure 15B:
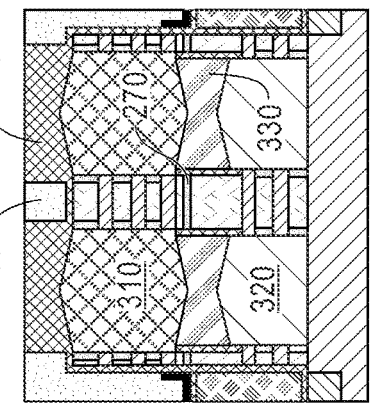
Figure 15C:
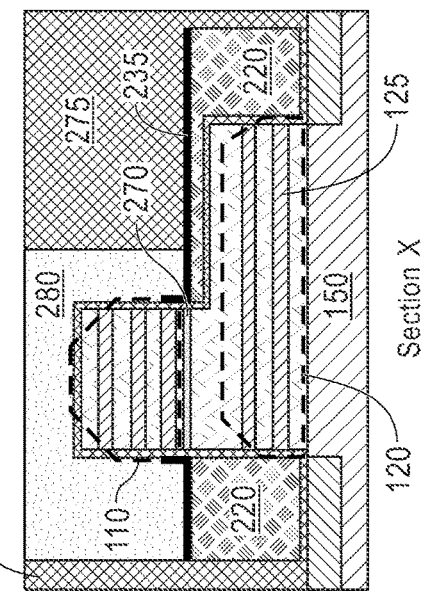

In FIGS. 15A-15C a cutting process for removing the dummy gate material 220 for the top gate element is shown. As shown in FIG. 15A, some of the dummy gate material 280 is removed. In one embodiment, the left side lateral boundary edge of the dummy gate material 280 shares the lateral boundary edge with the left side of the dummy gate material 220. The right side of the dummy gate material 280 may be removed laterally inward, past the outer right side lateral boundary edge of the dummy material 220. By offsetting the gate areas, room will become available to add a separate metal contact for the bottom gate accessed by the topside (which can be seen in FIG. 19B).

Figures 16A, 16B, 16C:
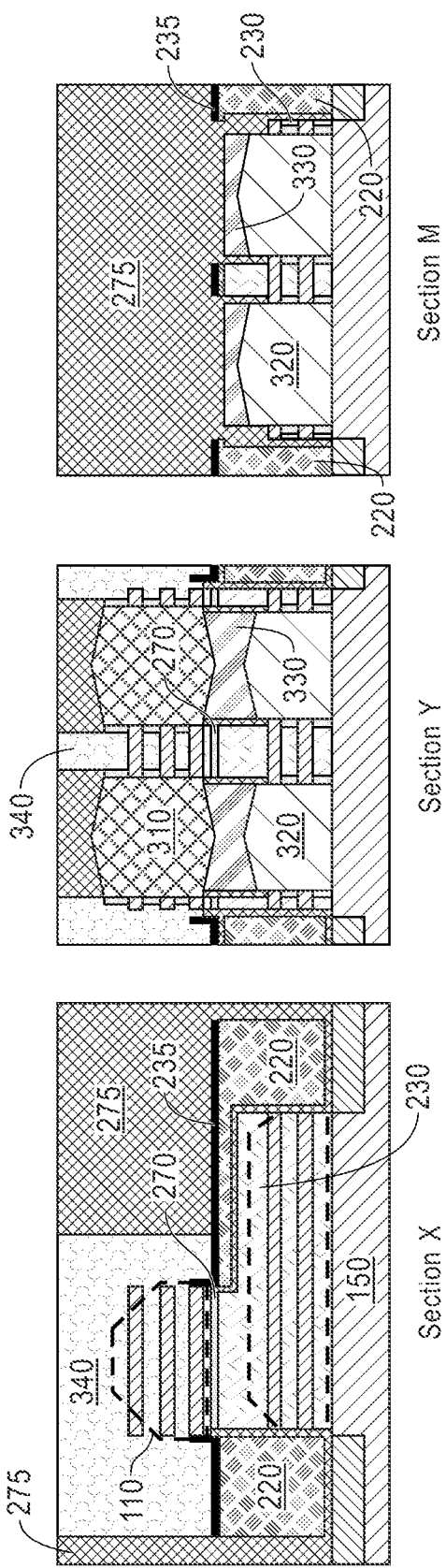
FIGS. 16A-16C show views replacing the top dummy gate material with a metal gate material, according to an embodiment.

In FIGS. 16A-16C the process removes the sacrificial layers 240 for the top stack of nanosheets and the top dummy gate material 280. The top dummy gate material 280 is replaced with a metal gate 340. It will be understood by those of ordinary skill in the art of the techniques available to replace the dummy gate material 280 with the metal gate 340. The removal of the sacrificial layers 240 may also form cavities in between the semiconductor channels 115. The deposition of the metal gate 340 may fill the channel cavities forming a mandrel around the channels. In some embodiments, the top transistor 110 may be a gate-all-around structure.

Figure 17A:
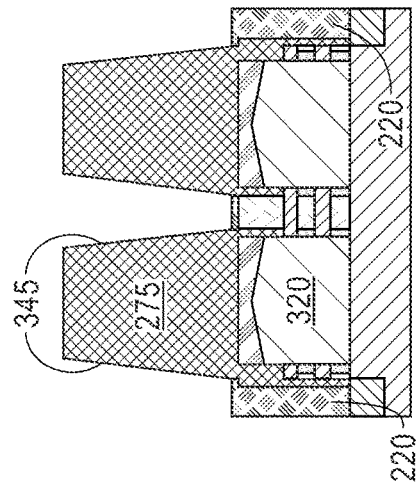
FIGS. 17A-17C show views of removing, from a top side, inter-dielectric material above the bottom dummy gate material, according to an embodiment.
Figure 17B:
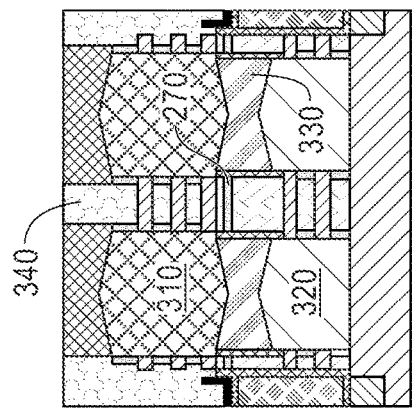
Figure 17C:
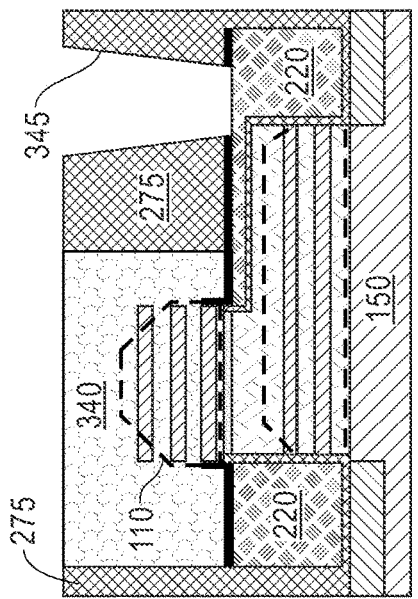
Figure 18A:
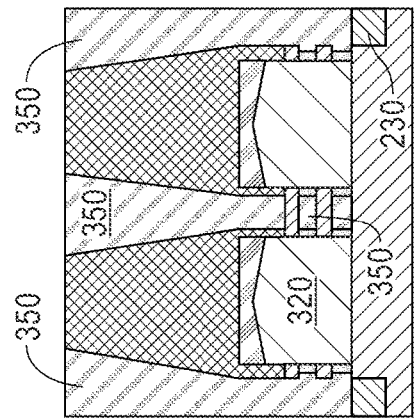
FIGS. 18A-18C show views replacing the bottom dummy gate material with a metal gate material, according to an embodiment.
Figure 18B:
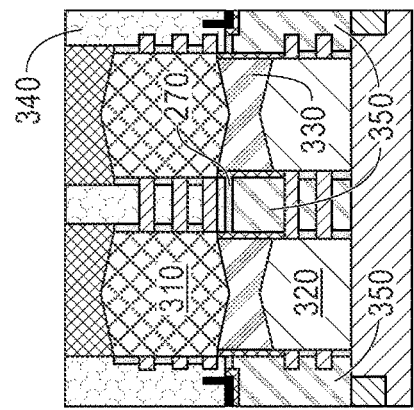
Figure 18C:
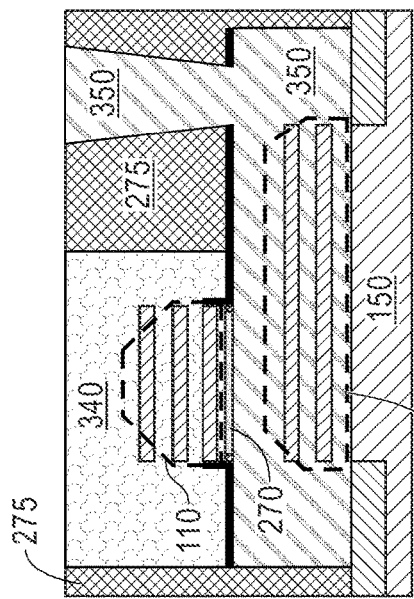

In FIGS. 17A-17C, an area of the oxide 275 above the dummy gate material 220 may be opened up. In the embodiment shown, the area opened up is above the section of the bottom nanosheet stack that extends laterally to the right of the top transistor 110. The opening may remove both the oxide 275 and a section of the dielectric 235, exposing the dummy gate material 220 to the top side of the device 100. FIGS. 18A-18C show the result of removing and replacing the dummy gate material 220 with a metal gate 350. The metal gate 350 may be the same metal or a different metal than the gate 340. Similar to the top transistor 110, the metal gate 350 may wrap around the channels 125 to form the transistor 120.

Figure 19A:
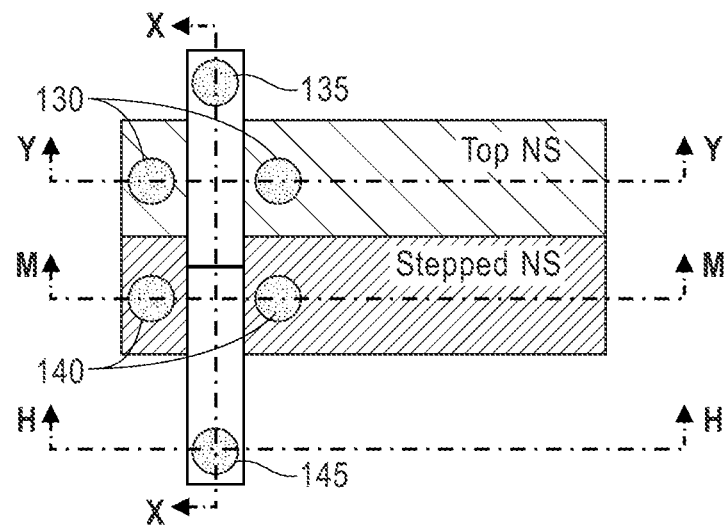
FIG. 19A is a legend similar to FIG. 2 but including a fourth axis M, consistent with embodiments.

FIGS. 19A-19E show an example of a resultant structure for the device 100 after metal contacts 130, 135, and 145 are added connecting the top gate 340 and the bottom gate 350 to the topside of the device 100. FIG. 19A is a legend that is similar to the legend in FIG. 2 except that a fourth axis H is added that shows a cross-sectional perspective along a bottom gate contact. Processes showing recess of materials to form the openings for the metal contacts 130, 135, and 145 are omitted.

Figure 19B:
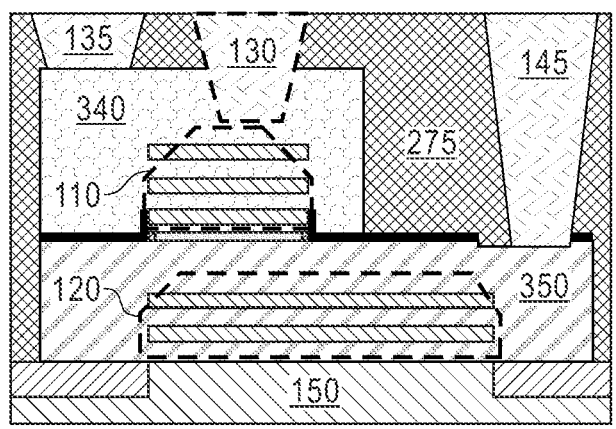
FIGS. 19B-19E show views forming metal contacts, according to an embodiment.
Figure 19C:
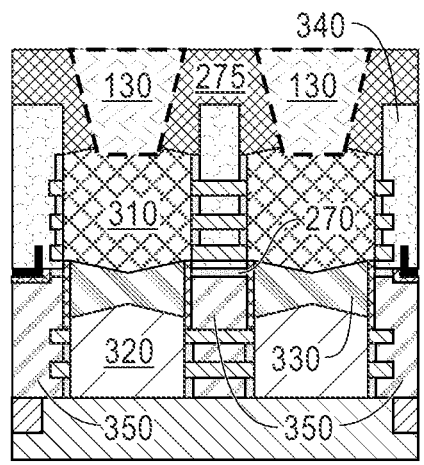
Figure 19D:
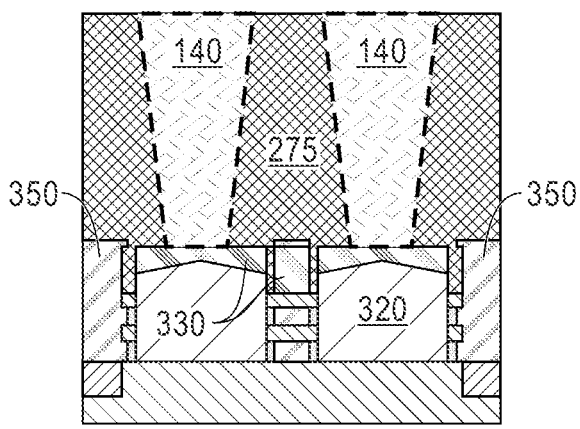
Figure 19E:
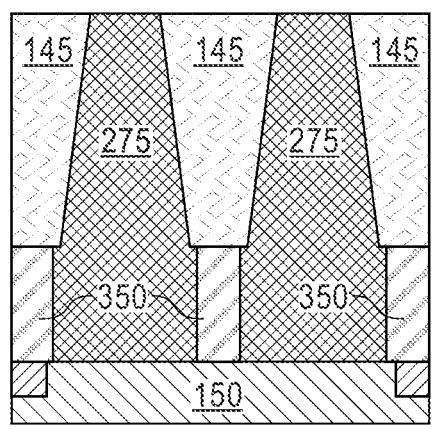

In FIG. 19B, a metal contact 130 electrically couples the source-drain of the top transistor 110 to the topside surface through the topside of the transistor 110. A metal contact 140 electrically couples the source-drain of the bottom transistor 120 to the topside surface through the topside of the transistor 120. The metal contact 135 electrically couples the gate 340 of the top transistor 110 to the topside surface. The metal contact 145 electrically couples the bottom gate 350 of the bottom transistor 120 to the topside surface. An additional perspective shown along axis H is added (as illustrated in FIG. 19D), which is from the perspective of a cross-section along the device structure containing a plurality of the metal contacts 145.

Figure 20A:
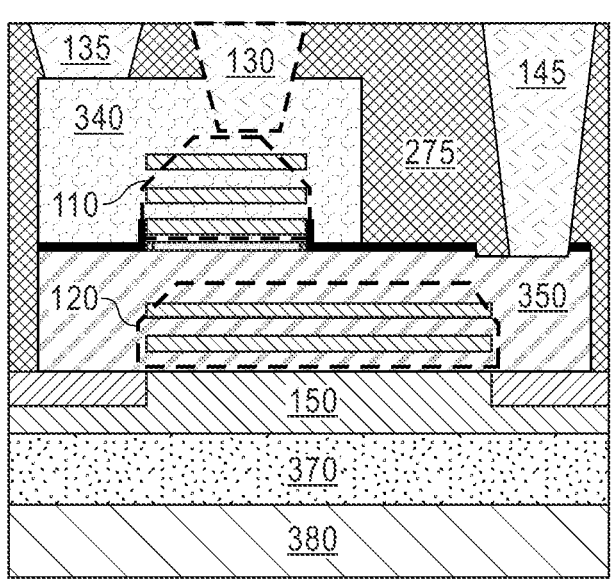
FIGS. 20A-20D show views coupling a back end of line layer and a carrier wafer to the bottom side of the substrate, according to an embodiment.
Figure 20B:
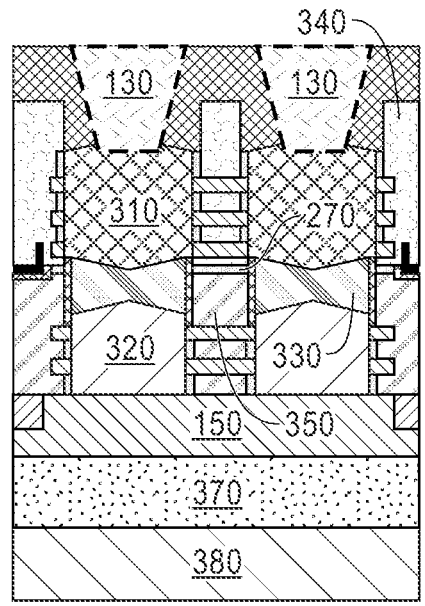
Figure 20C:
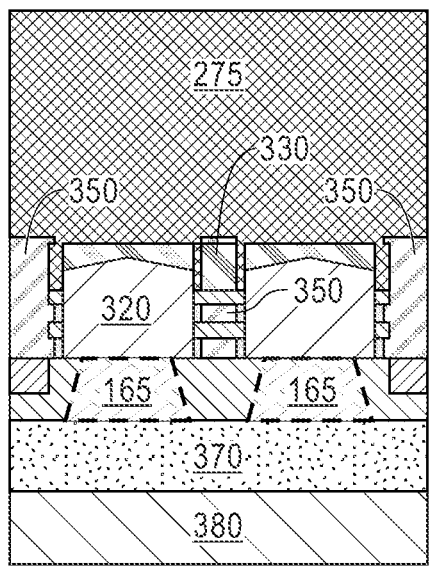
Figure 20D:
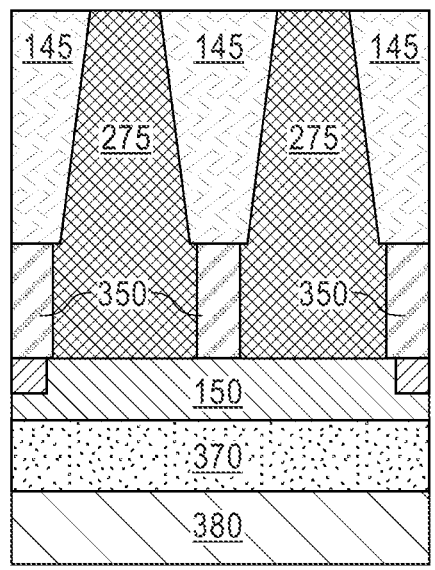

FIGS. 20A-20D show an embodiment of the device 100 that is similar to the embodiment shown in FIGS. 19B-19E except that the device 100 is configured for backside access of the bottom transistor 120. Metal contacts 165 may be formed on the backside of substrate 150 (FIG. 20C). The metal contacts 165 may be electrically coupled to the source drain areas 320 of the bottom transistor 120. In some embodiments, a back end of layer 370 may be formed under the substrate 150. Some embodiments may include a carrier wafer 380 formed under the back end of layer 370.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:
a first transistor;
a first gate electrically coupled to the first transistor;
a dielectric isolation layer on top of at least a portion of the first transistor;
a second transistor on top of at least a portion of the dielectric isolation layer;
a second gate electrically coupled to the second transistor, wherein the dielectric isolation layer is disposed to isolate the first gate from the second gate; and
a first conductive contact electrically coupled to the first gate, wherein the first conductive contact is within a first lateral boundary of the first transistor and outside of a second lateral boundary of the second transistor.

2. The semiconductor device of claim 1, further comprising a second conductive contact electrically coupled to the second gate, wherein the second conductive contact is within the first lateral boundary and within the second lateral boundary.

3. The semiconductor device of claim 1, further comprising:
a second conductive contact electrically coupled to a first source or drain of the first transistor, wherein the second conductive contact is connected to a frontside of the first transistor; and
a third conductive contact electrically coupled to a second source or drain of the first transistor, wherein the third conductive contact is connected to the frontside of the first transistor.

4. The semiconductor device of claim 3, further comprising:
a fourth conductive contact electrically coupled to a first source or drain of the second transistor, wherein the fourth conductive contact is connected to the frontside of the second transistor; and
a fifth conductive contact electrically coupled to a second source or drain of the second transistor, wherein the fifth conductive contact is connected to the frontside of the second transistor.

5. The semiconductor device of claim 1, further comprising:
a second conductive contact electrically coupled to a first source or drain of the first transistor, wherein the second conductive contact is connected to a backside of the first transistor;
a third conductive contact electrically coupled to a second source or drain of the first transistor, wherein the third conductive contact is connected to the backside of the first transistor;
a fourth conductive contact electrically coupled to a first source or drain of the second transistor, wherein the fourth conductive contact is connected to the frontside of the second transistor; and
a fifth conductive contact electrically coupled to a second source or drain of the second transistor, wherein the fifth conductive contact is connected to the frontside of the second transistor.

6. The semiconductor device of claim 1, further comprising stacks of nanosheets in the first transistor and in the second transistor.

7. A semiconductor device, comprising:
a first transistor;
a first gate electrically coupled to the first transistor;
a second transistor positioned on top of the first transistor;
a second gate electrically coupled to the second transistor;
a dielectric isolation layer positioned between the first gate and the second gate;
a first conductive contact electrically coupled to the first gate; and
a second conductive contact electrically coupled to the second gate, wherein a control of the first gate through the first conductive contact is independent of a control of the second gate through the second conductive contact.

8. The semiconductor device of claim 7, wherein the second gate is positioned on top of at least a portion of the first gate.

9. The semiconductor device of claim 7, further comprising stacks of nanosheets in the first transistor and in the second transistor.

10. The semiconductor device of claim 9, further comprising a gate material of the first and second gates, wherein the gate material is wrapped around the stacks of nanosheets.

11. The semiconductor device of claim 7, further comprising:
a third conductive contact electrically coupled to a first source or drain of the first transistor, wherein the third conductive contact is connected to a frontside of the first transistor;
a fourth conductive contact electrically coupled to a second source or drain of the first transistor, wherein the fourth conductive contact is connected to the frontside of the first transistor;
a fifth conductive contact electrically coupled to a first source or drain of the second transistor, wherein the fifth conductive contact is connected to the frontside of the second transistor; and
a sixth conductive contact electrically coupled to a second source or drain of the second transistor, wherein the sixth conductive contact is connected to the frontside of the second transistor.

12. The semiconductor device of claim 7, further comprising:
a third conductive contact electrically coupled to a first source or drain of the first transistor, wherein the third conductive contact is connected to a backside of the first transistor;
a fourth conductive contact electrically coupled to a second source or drain of the first transistor, wherein the fourth conductive contact is connected to the backside of the first transistor;

a fifth conductive contact electrically coupled to a first source or drain of the second transistor, wherein the fifth conductive contact is connected to the frontside of the second transistor; and a sixth conductive contact electrically coupled to a second source or drain of the second transistor, wherein the sixth conductive contact is connected to the frontside of the second transistor.

13. The semiconductor device of claim 7, wherein the first transistor is a nFET and the second transistor is a pFET.

14. The semiconductor device of claim 7, wherein the first transistor is a pFET and the second transistor is a nFET.

15. A method of manufacturing a semiconductor device, comprising:
  forming a first stack of nanosheets on a substrate;
  forming a second stack of nanosheets on top of the first stack of nanosheets;
  forming a first dummy gate adjacent the first stack of nanosheets and below a bottom nanosheet of the second stack of nanosheets;
  forming a dielectric isolation layer on top of the first dummy gate and in between the first stack of nanosheets and the second stack of nanosheets;
  forming a second dummy gate on top of the dielectric isolation layer and adjacent the second stack of nanosheets;
  replacing the first dummy gate with a bottom gate electrically coupled to the first stack of nanosheets, wherein the first stack of nanosheets form a first transistor in cooperation with a gate material of the bottom gate;
  replacing the second dummy gate with a top gate electrically coupled to the second stack of nanosheets, wherein the second stack of nanosheets form a second transistor in cooperation with a gate material of the top gate;
  forming a first conductive contact electrically coupled to the bottom gate; and
  forming a second conductive contact electrically coupled to the top gate, wherein a control of the bottom gate through the first conductive contact is independent of a control of the top gate through the second conductive contact.

16. The method of claim 15, further comprising forming the first stack of nanosheets to include a width greater than a width of the second stack of nanosheets.

17. The method of claim 16, further comprising:
  recessing a lateral boundary of the second dummy gate inward, wherein the lateral boundary of the second dummy gate is within a lateral boundary of the first dummy gate; and
  positioning the first conductive contact outside of a lateral boundary of the top gate and inside a lateral boundary of the bottom gate.

18. The method of claim 15, further comprising:
  forming a third conductive contact electrically coupled to a first source or drain of the first transistor, wherein the third conductive contact is connected to a frontside of the first transistor;
  forming a fourth conductive contact electrically coupled to a second source or drain of the first transistor, wherein the fourth conductive contact is connected to the frontside of the first transistor;
  forming a fifth conductive contact electrically coupled to a first source or drain of the second transistor, wherein the fifth conductive contact is connected to the frontside of the second transistor; and
  forming a sixth conductive contact electrically coupled to a second source or drain of the second transistor, wherein the sixth conductive contact is connected to the frontside of the second transistor.

19. The method of claim 15, further comprising:
  forming a third conductive contact electrically coupled to a first source or drain of the first transistor, wherein the third conductive contact is connected to a backside of the first transistor;
  forming a fourth conductive contact electrically coupled to a second source or drain of the first transistor, wherein the fourth conductive contact is connected to the backside of the first transistor;
  forming a fifth conductive contact electrically coupled to a first source or drain of the second transistor, wherein the fifth conductive contact is connected to the frontside of the second transistor; and
  forming a sixth conductive contact electrically coupled to a second source or drain of the second transistor, wherein the sixth conductive contact is connected to the frontside of the second transistor.

20. The method of claim 19, further comprising:
  forming a back end of line layer on a backside of the substrate; and
  forming a wafer carrier on a backside of the back end of line layer.

* * * * *